United States Patent
Bal et al.

(10) Patent No.: US 9,780,803 B1
(45) Date of Patent: Oct. 3, 2017

(54) APPARATUS FOR BUILT-IN SELF-TEST (BIST) OF A NYQUIST RATE ANALOG-TO-DIGITAL CONVERTER (ADC) CIRCUIT

(71) Applicant: STMicroelectronics International N.V., Amsterdam (NL)

(72) Inventors: Ankur Bal, Greater Noida (IN); Chandrajit Debnath, Greater Noida (IN); Neha Bhargava, Greater Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/266,445

(22) Filed: Sep. 15, 2016

(51) Int. Cl.
*H03M 1/10* (2006.01)
*H03M 3/00* (2006.01)

(52) U.S. Cl.
CPC ......... *H03M 1/1071* (2013.01); *H03M 3/344* (2013.01); *H03M 3/422* (2013.01); *H03M 3/464* (2013.01)

(58) Field of Classification Search
CPC .... H03M 1/1071; H03M 3/344; H03M 3/422; H03M 3/464
USPC .................................................. 341/120, 155
See application file for complete search history.

(56) References Cited

U.S. PATENT DOCUMENTS

| 5,959,562 | A  | * | 9/1999 | Wiesbauer | H03M 3/38 341/143 |
| 8,830,098 | B2 | * | 9/2014 | Mir | H03M 3/378 341/120 |
| 9,401,728 | B2 | * | 7/2016 | Doare | H03M 3/378 |

OTHER PUBLICATIONS

Algeria, et al. "Standard Histogram Test Precision of ADC Gain and Offset Error Estimation," IEEE Transactions on Instrumentation and Measurement 56 No. 5 (2007), 1527-1531.

(Continued)

*Primary Examiner* — Brian Young
(74) *Attorney, Agent, or Firm* — Gardere Wynne Sewell LLP

(57) ABSTRACT

A built-in self-test (BIST) circuit is provided for testing an analog-to-digital converter (ADC). A multi-order sigma-delta ($\Sigma\Delta$) modulator has an input that receives an input signal, a first output generating analog test signal derived from the input signal and applied to an input of the ADC and a second output generating a binary data stream. A digital recombination and filtering circuit has a first input that receives the binary data stream and a second input that receives a digital test signal output from the ADC in response to the analog test signal. The digital recombination and filtering circuit combines and filters the binary data stream and digital test signal to generate a digital result signal including a signal component derived from an error introduced by operation of the ADC. A correlation circuit is used to isolate that error signal component.

36 Claims, 2 Drawing Sheets

(56) References Cited

OTHER PUBLICATIONS

Dubois, et al., "Ternary Stimulus for Fully Digital Dynamic Testing of SC S? ADCs", in Mixed-Signals, Sensors and Systems Test Workshop (IMS3TW), 2012 18th International, May 14-16, 2012, pp. 5-10.
Kiss, et al., "Adaptive Digital Correction of Analog Errors in MASH ADCs—Part II. Correction Using Test-Signal Injection," IEEE Trans. on Circuits and Systems-II: Analog and Digital Signal Processing, vol. 47, No. 7, 2000.
Mohammadi, et al., "A Reduced-Sample-Rate 2-2-20 MASH-Delta-Sigma-Pipeline ADC Architecture," ICEE 2013.
Rolindez, et al. "A SNDR BIST for S? Analogue-to-Digital Converters", Proceedings of the 24th IEEE VLSI Test Symposium (VTS '06), 2006.

* cited by examiner

APPARATUS FOR BUILT-IN SELF-TEST (BIST) OF A NYQUIST RATE ANALOG-TO-DIGITAL CONVERTER (ADC) CIRCUIT

TECHNICAL FIELD

The present invention relates to the testing of a Nyquist rate analog-to-digital converter (ADC) circuit and, in particular, to the use of a built-in self-test (BIST) circuit for testing a Nyquist rate ADC circuit.

BACKGROUND

Analog-to-digital converter (ADC) circuits are common components of many integrated circuit designs. An ADC circuit encodes an analog input voltage to a discrete N-bit digital word. Each unique value (or code) of the N-bit digital word corresponds to a small range of analog input voltages referred to as the code width, with the range having a code center. The difference between the analog input voltage and the corresponding voltage of the nearest code center is referred to in the art as the quantization error. Since the ADC circuit has a finite number of output bits N, even an ideal ADC circuit produces some quantization error with every sample of the analog input voltage.

The operation of an ADC circuit differs from an ideal behavior in many ways, with the difference specified in terms of a number of performance figures of merit. Of some importance are the following figures of merit: a) integral nonlinearity (INL) which refers to the distance of the code centers from ideal; b) differential nonlinearity (DNL) which refers to the deviation of the code width from ideal; c) offset error which refers to deviation in ADC circuit behavior at zero from ideal; and d) gain error which refers to deviation in the slope of a line passing through the ADC end points at zero and full scale from ideal. Other performance figures of merit are also known in the art.

Because an ADC circuit provides a critical link between the analog circuit domain and the digital circuit domain in many integrated circuit devices, it is important that the ADC circuit operate within certain specification requirements for the performance figures of merit. Accordingly, it is well known in the art to test the ADC circuit and reject or tune the integrated circuit device which includes the ADC circuit in the event testing reveals ADC circuit operation outside of the specification requirements. One conventional technique for ADC circuit testing involves the application of an externally supplied analog test signal (such as a ramp or sinusoid) to the input of the ADC circuit, followed by the evaluation of the series of N-bit digital words that are output from the ADC circuit in response to the test stimulus signal.

There is, however, a need for a built-in self-test (BIST) circuit to generate the test stimulus signal for application to the input of the ADC circuit and evaluate the digital output.

SUMMARY

In an embodiment, an integrated circuit comprises: an analog circuit domain; a digital circuit domain; an analog-to-digital converter (ADC) circuit having an input coupled to the analog circuit domain and an output coupled to the digital circuit domain; and a built-in self-test (BIST) circuit configured to test operation of the ADC circuit. The BIST circuit comprises: a multi-order sigma-delta ($\Sigma\Delta$) modulator, for example, in a MASH topology, having an input configured to receive an input signal, a first output configured to generate analog test signal derived from the input signal and a second output configured to generate a binary data stream, wherein said analog test signal is applied to the input of the ADC circuit during a test mode operation; and a digital recombination and filtering circuit having a first input configured to receive the binary data stream and a second input configured to receive a digital test signal output from the ADC circuit in response to the analog test signal, said digital recombination and filtering circuit configured to combine and filter the binary data stream and digital test signal to generate a digital result signal having a first signal component derived from the input signal and a second signal component derived from an error introduced by operation of the ADC circuit.

In an embodiment, a built-in self-test (BIST) circuit for testing an analog-to-digital converter (ADC) circuit comprises: a multi-order sigma-delta ($\Sigma\Delta$) modulator having an input configured to receive an input signal, a first output configured to generate analog test signal derived from the input signal and a second output configured to generate a binary data stream, wherein said analog test signal is applied to an input of the ADC circuit during a test mode operation; and a digital recombination and filtering circuit having a first input configured to receive the binary data stream and a second input configured to receive a digital test signal output from the ADC circuit in response to the analog test signal, said digital recombination and filtering circuit configured to combine and filter the binary data stream and digital test signal to generate a digital result signal having a first signal component derived from the input signal and a second signal component derived from an error introduced by operation of the ADC circuit.

In an embodiment, a built-in self-test (BIST) circuit for testing an analog-to-digital converter (ADC) circuit comprises: a signal generator configured to generate an input signal; a multi-stage noise shaping (MASH) $\Sigma\Delta$ modulator configured to convert the input signal to a binary data stream and further output an analog test signal, wherein said binary data stream is a quantization of the analog test signal; a first digital summing circuit configured to subtract the binary data stream from a digital signal derived from a digital test signal output from the ADC circuit in response to a conversion of the analog test signal, said first digital summing circuit generating a first digital signal; a digital filtering circuit configured to high pass filter the first digital signal and generate a filtered digital signal; a second digital summing circuit configured to add the filtered digital signal to the binary data stream to generate a second digital signal; a decimator circuit configured to decimate the second digital signal to generate a digital result signal having a first signal component derived from the input signal and a second signal component derived from an error introduced by operation of the ADC circuit; and a correlation circuit configured to correlate said digital result signal against a reference signal that corresponds to said input signal in order to detect the second signal component derived from the error introduced by operation of the ADC circuit.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
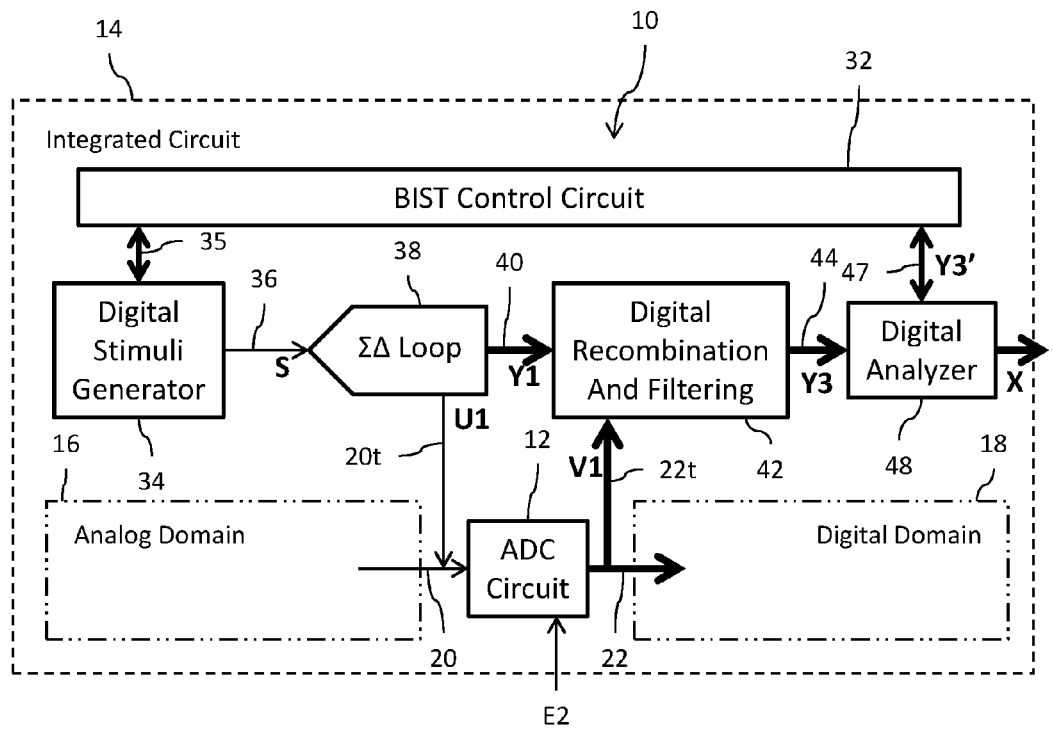
FIG. 1 is a block diagram of a built-in self-test (BIST) circuit for the testing of an analog-to-digital converter (ADC) circuit located on an integrated circuit chip.

Reference is now made to FIG. 1 showing a block diagram of a built-in self-test (BIST) circuit 10 for the testing of an analog-to-digital converter (ADC) circuit 12 located on an integrated circuit chip 14. The integrated circuit chip 14 may include an analog circuit domain 16 (including desired analog circuitry such as amplifier and sensor circuits) and a digital circuit domain 18 (including desired digital circuitry such as digital processing and logic circuits). The ADC circuit 12 is positioned between the two domains 16 and 18 and functions to convert an analog signal 20 output from the analog circuit domain 16 to a digital signal 22 for input to the digital circuit domain 18. In a preferred implementation, the ADC circuit 12 is a Nyquist rate ADC circuit. A Nyquist rate ADC circuit is a specific type of ADC circuit known in the art that is of a non-oversampling type with a bandwidth close to one-half of the sampling frequency. Different types of Nyquist rate ADC circuits are known including: flash, successive approximation, pipelined, etc. The built-in self-test (BIST) circuit 10 is operable to test any one of these ADC circuits.

The BIST circuit 10 includes a BIST control circuit 32 with digital logic circuits responsive to one or more test enable signals to control operation of all testing operations on the integrated circuit chip 14, including testing of the ADC circuit 12. A digital stimuli generator 34 is coupled 35 to the BIST control circuit 32 to receive load and control signaling output from the BIST control circuit 32 and output read signaling to the BIST control circuit 32. In particular, the load and control signaling output from the BIST control circuit 32 may comprise digital configuration and control information (such as data, clock and selection signals) for configuring or controlling the digital stimuli generator 34 to generate a particular input signal 36 (in either an analog or digital signal format). A sigma-delta (ΣΔ) modulator loop 38 converts the input signal 36 to a binary data stream signal 40 and a corresponding analog test signal 20t. The analog test signal 20t is applied to the input of the ADC circuit 12 during test mode operation. The ADC circuit 12 operates to perform an analog-to-digital conversion of the analog test signal 20t to output an N bit digital test signal 22t. A digital recombination and filtering circuit 42 receives the digital test signal 22t during test mode operation, combines the binary data stream signal 40 with the digital test signal 22t and filters the result of the combination to generate a multi-bit digital result signal 44. In an embodiment, digital recombination and filtering circuit 42 operates as a digital noise cancellation filter. A digital analyzer circuit 48 is coupled 47 to the BIST control circuit 32 to receive load and control signaling from the BIST control circuit 32 and output read signaling to the BIST control circuit 32. In particular, the load and control signaling may comprise digital information concerning a desired (reference) digital signal based on the control exercised over the operation of the digital stimuli generator 34 to generate the input signal 36 (i.e., the desired digital signal is a digital representation corresponding to the input signal). The digital analyzer circuit 48 further receives the multi-bit digital result signal 44 output from the digital recombination and filtering circuit 42. A correlation process is performed by the digital analyzer circuit 48 to compare the multi-bit digital result signal 44 to the desired digital signal. Any deviation there between identified by the digital analyzer circuit 48 is indicative of error in the operation of the ADC circuit 12. The deviations may be output as read signaling to the BIST control circuit 32, and actions may be taken by the BIST control circuit 32 in response to the identified deviations to produce test result data (for example, during a scan out function of the BIST testing).

Figure 2:
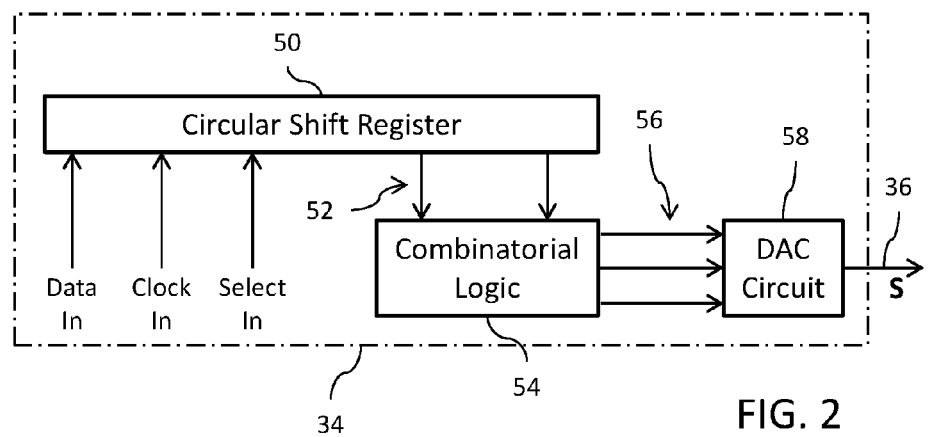
FIG. 2 is a block diagram of the digital stimuli generator used in the circuit of FIG. 1.

Reference is now made to FIG. 2 showing a block diagram of an example circuit for the digital stimuli generator 34. The example circuit of the digital stimuli generator 34 is of the digital ternary stimulus type. A circular shifter register 50 includes a plurality of D-type flip-flop. The data output Q of one flip-flop is connected to the data input D of a next successive flip-flop. The data output Q of the last flip-flop is fed back to the data input D of the first flip-flop through a multiplexer circuit. The multiplexer further receives a Data In signal from the BIST control circuit 32 and the selection operation of the multiplexer is controlled by a Select In signal also received from the BIST control circuit 32. The flip-flops in the circular shifter register 50 are clocked by a common clock signal Clock In which may be either a modulator sampling clock or an external clock as selected by the BIST control circuit 32. Data outputs Q of two (or more) of the flip-flops in the circular shifter register 50 produce digital binary stimulus signals 52 that are output to a combinatorial logic circuit 54 configured to generate digital ternary stimulus signals 56. The combinatorial logic circuit 54 includes one or more logic gates to logically combine the digital binary stimulus signals 52 to generate each of the digital ternary stimulus signals 56. For example, a logic AND gate may be provided to generate the first one of the digital ternary stimulus signals 56, a logic XOR gate may be provided to generate the second one of the digital ternary stimulus signals 56 and a logic NOR gate may be provided to generate the third one of the digital ternary stimulus signals 56. A digital-to-analog converter (DAC) circuit 58 converts the digital ternary stimulus signals 56 to generate the input signal 36. In this implementation, the DAC circuit 58 is a 3-bit DAC. The digital ternary stimulus signals 56 in this implementation are pulse density modulated (PDM) signals.

It will be understood that any suitable circuit for storing the digital stimuli may be used. For example, a memory circuit (RAM or ROM) could be used. Alternatively, a digital ΣΔ modulator could be used to generate the digital stimuli.

Although the DAC circuit 58 is illustrated as a 3-bit DAC, it will be understood that this is just an example and that the DAC may have as many inputs as desired to effectuate the generation of the analog signal. Thus, the illustration of ternary circuit just one example of a suitable circuit. Binary and other multilevel implementations may be used.

Figure 3:
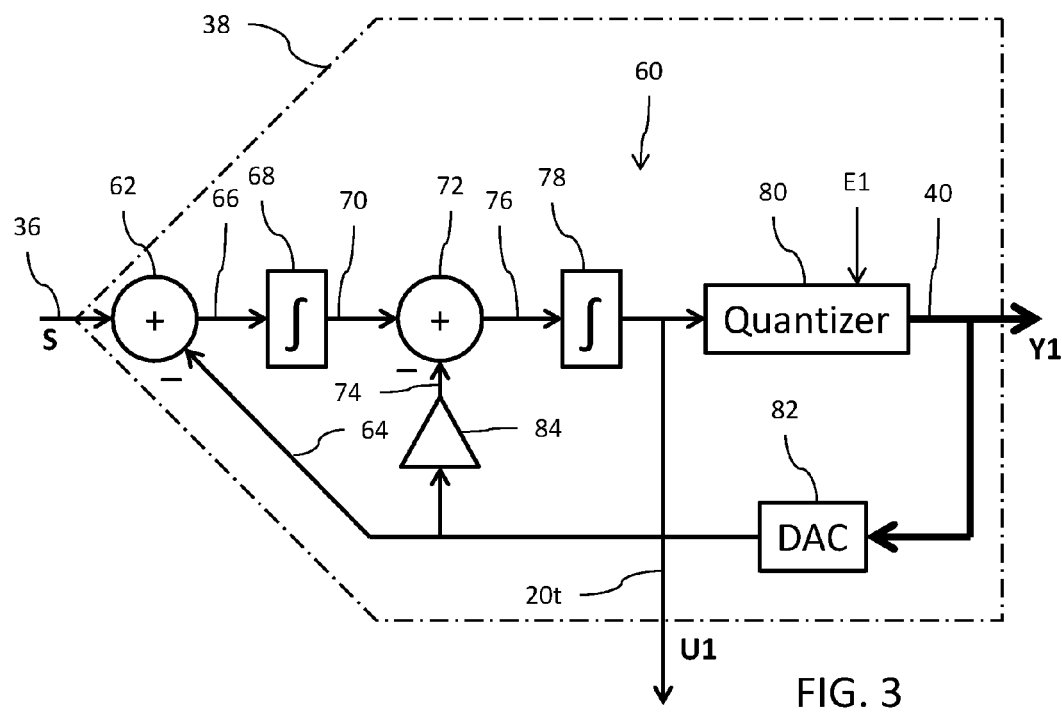
FIG. 3 is a block diagram of the ΣΔ modulator loop used in the circuit of FIG. 1.

Reference is now made to FIG. 3 showing a block diagram of the ΣΔ modulator loop 38. The ΣΔ modulator loop 38 is implemented as a second order multi-stage noise shaping (MASH) ΣΔ modulator 60. The input signal 36 is received at a first input of a summing circuit 62. A second input of the summing circuit 62 receives a first analog feedback signal 64. The summing circuit 62 functions to subtract the first feedback signal 64 from the input signal 36 to generate a first analog signal 66. A first integrator circuit 68 integrates the first analog signal 66 to generate a second analog signal 70. The first integrator circuit 68 has a transfer function of $(0.25z^{-1}/(1-z^{-1}))$ and thus provides for analog signal integration with a gain of 0.25. A summing circuit 72 has a first input that receives the second analog signal 70 and a second input that receives a second analog feedback signal 74. The summing circuit 72 functions to subtract the second analog feedback signal 74 from the second analog signal 70 to generate a third analog signal 76. A second integrator circuit 78 integrates the third analog signal 76 to generate the analog test signal 20t. The second integrator circuit 78 has a transfer function of $(0.5z^{-1}/(1-z^{-1}))$ and thus for provides analog signal integration with a gain of 0.5. A quantizer circuit 80 quantizes the analog test signal 20t to generate the binary data stream signal 40 (which is a digitized representation of the input signal 36). If the quantizer circuit 80 is a multibit quantizer, then a digital-to-analog converter (DAC) circuit 82 is provided to convert the multi-bit binary data stream signal 40 to analog to generate the first analog feedback signal 64. If the quantizer circuit 80 is a single bit quantizer, then the DAC circuit 82 may be omitted and the binary data stream signal 40 would be the first analog feedback signal 64. A gain stage 84 has an input to receive the first analog feedback signal 64 and an output generating the second analog feedback signal 74. The gain stage 84 applies a gain value of 0.5.

Figure 4:
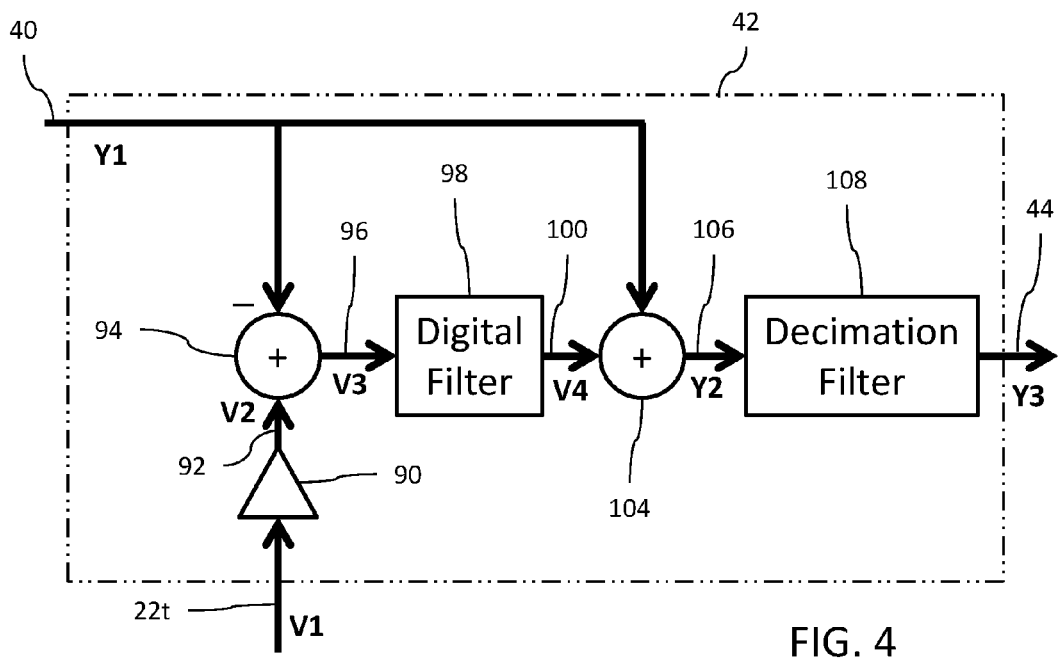
FIG. 4 is a block diagram of the digital recombination and filtering circuit used in the circuit of FIG. 1.

Reference is now made to FIG. 4 showing a block diagram of the digital recombination and filtering circuit 42. The digital recombination and filtering circuit 42 includes a digital gain stage 90 having an input receiving the N bit digital test signal 22t and an output generating the digital signal 92. In an embodiment, the gain stage 90 applies a gain value of M. The gain M is provided to compensate for the fractional gains of the integrators used in the analog MASH ΣΔ modulator 60. In the disclosed example implementation, the gain M=1/(0.25×0.5)=8. A first digital summing circuit 94 has a first input that receives the digital signal 92 and a second input that receives the binary data stream signal 40. The first digital summing circuit 94 functions to subtract the binary data stream signal 40 from the digital signal 92 to generate a first combined digital signal 96. A digital filtering circuit 98 filters the first combined digital signal 96 to generate a filtered digital signal 100. The digital filtering circuit 98 implements a high pass filtering function, and may, for example, have a transfer function represented as: $(1-z^{-1})^2$. A second digital summing circuit 104 has a first input that receives the filtered digital signal 100 and a second input that receives the binary data stream signal 40. The second digital summing circuit 104 functions to add the filtered digital signal 100 to the binary data stream signal 40 to generate a second combined digital signal 106. A decimation filter 108 decimates the second combined digital signal 106 to generate the multi-bit digital result signal 44.

Operation of the circuit in test mode is as follows:

Let S be the input signal 36 generated by the digital stimuli generator 34.

Let U1 be the analog test signal 20t generated by the ΣΔ modulator loop 38 and let Y1 be the binary data stream signal 40 generated by the quantizer circuit 80 from quantization of the analog test signal 20t. In this context, Y1 is the quantization of U1 plus an added error component E1 that is attributed to the quantization operation:

$$Y1=U1+E1=Sz^{-1}+E1(1-z^{-1})^2 \qquad \text{Eq. 1}$$

Let V1 be the digital test signal 22t generated by the ADC circuit 12 from conversion of the analog test signal 20t (U1) to digital form. In this context, V1 is the digitized version of U1 plus an added error component E2 that is attributed to the analog-to-digital conversion operation:

$$V1=(1/M)U1+E2 \qquad \text{Eq. 2}$$

wherein: M is as described above, and in an example implementation M=8. The added error component E2 represents one or more of the integral nonlinearity (INL) error, differential nonlinearity (DNL) error, offset error and or gain error of the ADC 12, and perhaps other errors associated with ADC operation. It is this error (represented by E2) that is to be discovered in the test mode operation.

Let V2 be the digital signal 92 output by the digital gain stage 90. The digital gain stage 90 applies a gain value of M (where M=8, for example), and thus:

$$V2=U1+8*E2 \qquad \text{Eq. 3}$$

Let V3 be the first combined digital signal 96 output from the first digital summing circuit 94. In this context:

$$V3=V2-Y1 \qquad \text{Eq. 4}$$

$$V3=(U1+8E2)-(U1+E1)=8E2-E1 \qquad \text{Eq. 5}$$

Let V4 be the filtered digital signal 100 generated by the digital filtering circuit 98. In this context:

$$V4=(1-z^{-1})^2*(8E2-E1) \qquad \text{Eq. 6}$$

Let Y2 be the second combined digital signal 106 generated by the second digital summing circuit 104. In this context:

$$Y2=V4+Y1 \qquad \text{Eq. 7}$$

$$Y2=8E2(1-z^{-1})^2-E1(1-z^{-1})^2+Sz^{-1}+E1(1-z^{-1})^2 \qquad \text{Eq. 8}$$

$$Y2=8E2(1-z^{-1})^2+Sz^{-1} \qquad \text{Eq. 9}$$

where: the signal component $Sz^{-1}$ represents the digital conversion of the input signal 36 (S) and the signal component $8E2(1-z^{-1})^2$ represents the high pass filtered error component E2 that is attributed to digital conversion operation performed by the ADC 12. It will be noted that the configuration of the digital recombination and filtering circuit 42 has effectively canceled out the error component E1 that is attributed to the quantization operation performed by the quantizer circuit 80.

To support the correlation processing operation, the second combined digital signal 106 (Y2) is decimated by the decimation filter 108 to generate the multi-bit digital result signal 44 (Y3). This decimation functions to reduce data rate. In this context, the input and output digital signals to the digital noise cancelation filter are at an oversampled rate, but have a lower precision than P. The digital noise cancelation filter output content is an N bit PDM data signal. Next, the data rate is reduced by passing the PDM data through the decimation filter. After decimation filtering, the digital signal output rate is reduced and also the signal content is PCM (with P=16, for example). Furthermore, in an embodiment, the second combined digital signal 106 (Y2) will include both pulse code modulated (PCM) content and pulse density modulated (PDM) content. In such a case, the decimation serves to remove the PDM content such that the multi-bit digital result signal 44 (Y3) includes only PCM content.

The input signal 36 (S) is a known quantity (it is controlled by the BIST control circuit 32 through the digital stimuli generator 34), and its digitized version $Sz^{-1}$ is thus also a known quantity and is represented by the desired (i.e., expected) digital signal Y3' (in PCM format) that is supplied by the BIST control circuit 32 to the digital analyzer circuit 48. The digital analyzer circuit 48 now performs a correlation between the multi-bit digital result signal 44 (Y3) and that desired digital signal (Y3'). The signal Y3 comprises a signal component S, which is $Sz^{-1}$, and an error component that is proportional to the non-linearity and quantization error E2, which is $8E2(1-z^{-1})^2$, of the ADC circuit 12 being tested. In the digital analyzer circuit 48, the signal Y3 is cross-correlated to a PCM version of the signal S (i.e., the known signal that was input to the modulator as the test stimuli) to obtain a result X which is proportional to the signal to noise ratio and total harmonic distortion of the signal which are closely coupled to the INL and DNL of the ADC circuit 12. The result X is compared to reference values specified by the system designer. If X deviates from specified reference values, a determination may be made through the BIST control circuit 32 that the ADC 12 is defective and thus the integrated circuit 14 would also be defective.

It will be understood that for an integrated circuit 14 incorporating multiple ADCs 12, the BIST circuit 10 may be used in test mode to sequentially test each of the included ADCs 12.

An advantage of the BIST circuit 10 is that, with the exception of the second order MASH ΣΔ modulator 60, the remainder of the circuit may be implemented using a digital circuit design. Thus, there is a low overhead penalty associated with inclusion of the BIST circuit 10 on the integrated circuit 14. The overhead penalty is further reduced when the BIST circuit 10 is used to support sequential testing of multiple ADCs 12.

An advantage of using the second order MASH ΣΔ modulator 60 is that the circuit is insensitive to process imperfections.

A further advantage of the BIST circuit 10 is that it does not require any external components or external pads for accessing the ADC circuit 12. All signals for test are generated on and evaluated on the integrated circuit 14 using the BIST circuit 10.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An integrated circuit, comprising:
   an analog circuit domain;
   a digital circuit domain;
   an analog-to-digital converter (ADC) circuit having an input coupled to the analog circuit domain and an output coupled to the digital circuit domain; and
   a built-in self-test (BIST) circuit configured to test operation of the ADC circuit, said BIST circuit comprising:
      a multi-order sigma-delta (ΣΔ) modulator having an input configured to receive an input signal, a first output configured to generate analog test signal derived from the input signal and a second output configured to generate a binary data stream, wherein said analog test signal is applied to the input of the ADC circuit during a test mode operation; and
      a digital recombination and filtering circuit having a first input configured to receive the binary data stream and a second input configured to receive a digital test signal output from the ADC circuit in response to the analog test signal, said digital recombination and filtering circuit configured to combine and filter the binary data stream and digital test signal to generate a digital result signal having a first signal component derived from the input signal and a second signal component derived from an error introduced by operation of the ADC circuit.

2. The integrated circuit of claim 1, wherein the multi-order ΣΔ modulator is a second order ΣΔ modulator.

3. The integrated circuit of claim 1, wherein the multi-order ΣΔ modulator is a multi-stage noise shaping (MASH) ΣΔ modulator.

4. The integrated circuit of claim 1, wherein the multi-order ΣΔ modulator includes a quantizer circuit configured to quantize the analog test signal to generate the binary data stream.

5. The integrated circuit of claim 4, wherein said binary data stream includes an error introduced by operation of the quantizer, and wherein the digital recombination and filtering circuit is configured to cancel said error introduced by operation of the quantizer from appearing in the digital result signal.

6. The integrated circuit of claim 1, wherein the digital recombination and filtering circuit comprises:
   a first digital summing circuit configured to subtract the binary data stream from a digital signal derived from the digital test signal to generate a first digital signal;
   a digital filtering circuit configured to filter the first digital signal to generate a filtered digital signal; and
   a second digital summing circuit configured to add the filtered digital signal to the binary data stream to generate a second digital signal.

7. The integrated circuit of claim 6, wherein said digital recombination and filtering circuit further comprises a decimation circuit configured to decimate the second digital signal to generate said digital result signal.

8. The integrated circuit of claim 1, further comprising a correlation circuit configured to correlate said digital result signal against a reference signal to obtain a result whose value is influenced by said second signal component and indicative of the error introduced by operation of the ADC circuit.

9. The integrated circuit of claim 8, wherein said reference signal is a digital signal which corresponds to said input signal.

10. The integrated circuit of claim 1, wherein said ADC circuit is a Nyquist rate ADC circuit.

11. A built-in self-test (BIST) circuit for testing an analog-to-digital converter (ADC) circuit, comprising:
   a multi-order sigma-delta (ΣΔ) modulator having an input configured to receive an input signal, a first output configured to generate analog test signal derived from the input signal and a second output configured to generate a binary data stream, wherein said analog test signal is applied to an input of the ADC circuit during a test mode operation; and
   a digital recombination and filtering circuit having a first input configured to receive the binary data stream and a second input configured to receive a digital test signal output from the ADC circuit in response to the analog test signal, said digital recombination and filtering circuit configured to combine and filter the binary data stream and digital test signal to generate a digital result signal having a first signal component derived from the input signal and a second signal component derived from an error introduced by operation of the ADC circuit; and
   wherein the multi-order ΣΔ modulator is a multi-stage noise shaping (MASH) ΣΔ modulator.

12. A built-in self-test (BIST) circuit for testing an analog-to-digital converter (ADC) circuit, comprising:

a multi-order sigma-delta (ΣΔ) modulator having an input configured to receive an input signal, a first output configured to generate analog test signal derived from the input signal and a second output configured to generate a binary data stream, wherein said analog test signal is applied to an input of the ADC circuit during a test mode operation;

a digital recombination and filtering circuit having a first input configured to receive the binary data stream and a second input configured to receive a digital test signal output from the ADC circuit in response to the analog test signal, said digital recombination and filtering circuit configured to combine and filter the binary data stream and digital test signal to generate a digital result signal having a first signal component derived from the input signal and a second signal component derived from an error introduced by operation of the ADC circuit;

a BIST control circuit configured to control generation of the input signal and supply a reference digital signal that corresponds to said input signal; and a correlation circuit having a first input to receive the reference digital signal from the BIST control circuit and a second input to receive the digital result signal from the digital recombination and filtering circuit, said correlation circuit configured to correlate the digital result signal against the reference digital signal to obtain a result whose value is influenced by said second signal component and indicative of the error introduced by operation of the ADC circuit.

13. A built-in self-test (BIST) circuit for testing an analog-to-digital converter (ADC) circuit, comprising:

a multi-order sigma-delta (ΣΔ) modulator having an input configured to receive an input signal, a first output configured to generate analog test signal derived from the input signal and a second output configured to generate a binary data stream, wherein said analog test signal is applied to an input of the ADC circuit during a test mode operation; and a digital recombination and filtering circuit having a first input configured to receive the binary data stream and a second input configured to receive a digital test signal output from the ADC circuit in response to the analog test signal, said digital recombination and filtering circuit configured to combine and filter the binary data stream and digital test signal to generate a digital result signal having a first signal component derived from the input signal and a second signal component derived from an error introduced by operation of the ADC circuit; and wherein the multi-order ΣΔ modulator is a second order ΣΔ modulator.

14. A built-in self-test (BIST) circuit for testing an analog-to-digital converter (ADC) circuit, comprising:

a multi-order sigma-delta (ΣΔ) modulator having an input configured to receive an input signal, a first output configured to generate analog test signal derived from the input signal and a second output configured to generate a binary data stream, wherein said analog test signal is applied to an input of the ADC circuit during a test mode operation, and wherein the multi-order ΣΔ modulator includes a quantizer circuit configured to quantize the analog test signal to generate the binary data stream, and wherein the multi-order ΣΔ modulator includes a quantizer circuit configured to quantize the analog test signal to generate the binary data stream; and a digital recombination and filtering circuit having a first input configured to receive the binary data stream and a second input configured to receive a digital test signal output from the ADC circuit in response to the analog test signal, said digital recombination and filtering circuit configured to combine and filter the binary data stream and digital test signal to generate a digital result signal having a first signal component derived from the input signal and a second signal component derived from an error introduced by operation of the ADC circuit;

wherein said binary data stream includes an error introduced by operation of the quantizer circuit, and wherein the digital recombination and filtering circuit is configured to cancel said error introduced by operation of the quantizer circuit from appearing in the digital result signal.

15. A built-in self-test (BIST) circuit for testing an analog-to-digital converter (ADC) circuit, comprising:

a multi-order sigma-delta (ΣΔ) modulator having an input configured to receive an input signal, a first output configured to generate analog test signal derived from the input signal and a second output configured to generate a binary data stream, wherein said analog test signal is applied to an input of the ADC circuit during a test mode operation; and a digital recombination and filtering circuit having a first input configured to receive the binary data stream and a second input configured to receive a digital test signal output from the ADC circuit in response to the analog test signal, said digital recombination and filtering circuit configured to combine and filter the binary data stream and digital test signal to generate a digital result signal having a first signal component derived from the input signal and a second signal component derived from an error introduced by operation of the ADC circuit;

wherein the digital recombination and filtering circuit comprises:
  a first digital summing circuit configured to subtract the binary data stream from a digital signal derived from the digital test signal to generate a first digital signal;
  a digital filtering circuit configured to filter the first digital signal to generate a filtered digital signal; and
  a second digital summing circuit configured to add the filtered digital signal to the binary data stream to generate a second digital signal.

16. The BIST circuit of claim 15, wherein said digital recombination and filtering circuit further comprises a decimation circuit configured to decimate the second digital signal to generate said digital result signal.

17. A built-in self-test (BIST) circuit for testing an analog-to-digital converter (ADC) circuit, comprising:

a multi-order sigma-delta (ΣΔ) modulator having an input configured to receive an input signal, a first output configured to generate analog test signal derived from the input signal and a second output configured to generate a binary data stream, wherein said analog test signal is applied to an input of the ADC circuit during a test mode operation; and a digital recombination and filtering circuit having a first input configured to receive the binary data stream and a second input configured to receive a digital test signal output from the ADC circuit in response to the analog test signal, said digital recombination and filtering circuit configured to combine and filter the binary data stream and digital test signal to generate a digital result signal having a first signal component derived from the input signal and a second signal component derived from an error introduced by operation of the ADC circuit;

wherein said ADC circuit is a Nyquist rate ADC circuit.

18. A built-in self-test (BIST) circuit for testing an analog-to-digital converter (ADC) circuit, comprising:
a signal generator configured to generate an input signal;
a multi-stage noise shaping (MASH) ΣΔ modulator configured to convert the input signal to a binary data stream and further output an analog test signal, wherein said binary data stream is a quantization of the analog test signal;
a first digital summing circuit configured to subtract the binary data stream from a digital signal derived from a digital test signal output from the ADC circuit in response to a conversion of the analog test signal, said first digital summing circuit generating a first digital signal;
a digital filtering circuit configured to high pass filter the first digital signal and generate a filtered digital signal;
a second digital summing circuit configured to add the filtered digital signal to the binary data stream to generate a second digital signal;
a decimator circuit configured to decimate the second digital signal to generate a digital result signal having a first signal component derived from the input signal and a second signal component derived from an error introduced by operation of the ADC circuit; and
a correlation circuit configured to correlate said digital result signal against a reference signal that corresponds to said input signal in order to obtain a result whose value is influenced by said second signal component and indicative of the error introduced by operation of the ADC circuit.

19. The BIST circuit of claim 11, further comprising a correlation circuit configured to correlate the digital result signal against a reference digital signal to obtain a result whose value is influenced by said second signal component and indicative of the error introduced by operation of the ADC circuit.

20. The BIST circuit of claim 11, wherein the multi-stage noise shaping (MASH) ΣΔ modulator is a second order ΣΔ modulator.

21. The BIST circuit of claim 11, wherein said binary data stream includes an error introduced by a quantization operation, and wherein the digital recombination and filtering circuit is configured to cancel said error from appearing in the digital result signal.

22. The BIST circuit of claim 11, wherein the digital recombination and filtering circuit comprises:
a first digital summing circuit configured to subtract the binary data stream from a digital signal derived from the digital test signal to generate a first digital signal;
a digital filtering circuit configured to filter the first digital signal to generate a filtered digital signal; and
a second digital summing circuit configured to add the filtered digital signal to the binary data stream to generate a second digital signal.

23. The BIST circuit of claim 22, wherein said digital recombination and filtering circuit further comprises a decimation circuit configured to decimate the second digital signal to generate said digital result signal.

24. The BIST circuit of claim 11, wherein said ADC circuit is a Nyquist rate ADC circuit.

25. The BIST circuit of claim 13, further comprising a correlation circuit configured to correlate the digital result signal against a reference digital signal to obtain a result whose value is influenced by said second signal component and indicative of the error introduced by operation of the ADC circuit.

26. The BIST circuit of claim 13, wherein the second order ΣΔ modulator is a multi-stage noise shaping (MASH) ΣΔ modulator.

27. The BIST circuit of claim 13, wherein said binary data stream includes an error introduced by a quantization operation, and wherein the digital recombination and filtering circuit is configured to cancel said error from appearing in the digital result signal.

28. The BIST circuit of claim 13, wherein the digital recombination and filtering circuit comprises:
a first digital summing circuit configured to subtract the binary data stream from a digital signal derived from the digital test signal to generate a first digital signal;
a digital filtering circuit configured to filter the first digital signal to generate a filtered digital signal; and
a second digital summing circuit configured to add the filtered digital signal to the binary data stream to generate a second digital signal.

29. The BIST circuit of claim 28, wherein said digital recombination and filtering circuit further comprises a decimation circuit configured to decimate the second digital signal to generate said digital result signal.

30. The BIST circuit of claim 13, wherein said ADC circuit is a Nyquist rate ADC circuit.

31. The BIST circuit of claim 17, further comprising a correlation circuit configured to correlate the digital result signal against a reference digital signal to obtain a result whose value is influenced by said second signal component and indicative of the error introduced by operation of the ADC circuit.

32. The BIST circuit of claim 17, wherein the multi-order sigma-delta (ΣΔ) modulator is a multi-stage noise shaping (MASH) ΣΔ modulator.

33. The BIST circuit of claim 17, wherein the multi-order sigma-delta (ΣΔ) is a second order ΣΔ modulator.

34. The BIST circuit of claim 17, wherein said binary data stream includes an error introduced by a quantization operation, and wherein the digital recombination and filtering circuit is configured to cancel said error from appearing in the digital result signal.

35. The BIST circuit of claim 17, wherein the digital recombination and filtering circuit comprises:
a first digital summing circuit configured to subtract the binary data stream from a digital signal derived from the digital test signal to generate a first digital signal;
a digital filtering circuit configured to filter the first digital signal to generate a filtered digital signal; and
a second digital summing circuit configured to add the filtered digital signal to the binary data stream to generate a second digital signal.

36. The BIST circuit of claim 35, wherein said digital recombination and filtering circuit further comprises a decimation circuit configured to decimate the second digital signal to generate said digital result signal.

* * * * *